United States Patent
Huang et al.

(10) Patent No.: US 8,618,672 B2
(45) Date of Patent: Dec. 31, 2013

(54) THREE DIMENSIONAL STACKED CHIP PACKAGE STRUCTURE

(75) Inventors: Yu-Wei Huang, Taichung (TW);
Tsung-Fu Yang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 318 days.

(21) Appl. No.: 13/154,423

(22) Filed: Jun. 6, 2011

(65) Prior Publication Data

US 2012/0168967 A1 Jul. 5, 2012

(30) Foreign Application Priority Data

Dec. 31, 2010 (TW) .............................. 99147323 A

(51) Int. Cl.
*H01L 25/00* (2006.01)
(52) U.S. Cl.
USPC ............ 257/777; 257/E25.006; 257/E25.013; 257/E25.021; 257/E25.027
(58) Field of Classification Search
None
See application file for complete search history.

(56) References Cited

U.S. PATENT DOCUMENTS

| | | | |
|---|---|---|---|
| 6,225,704 B1 | 5/2001 | Sumita et al. | |
| 6,573,592 B2 | 6/2003 | Bolken | |
| 6,759,307 B1 | 7/2004 | Yang | |
| 6,946,732 B2 | 9/2005 | Akram et al. | |
| 7,148,560 B2 | 12/2006 | Lee et al. | |
| 7,279,366 B2 | 10/2007 | Bolken | |
| 7,459,348 B2* | 12/2008 | Saeki | 438/125 |
| 2002/0102769 A1 | 8/2002 | Shibue | |
| 2003/0183950 A1 | 10/2003 | Bolken | |
| 2010/0078791 A1 | 4/2010 | Yim et al. | |
| 2010/0304536 A1 | 12/2010 | Sumita | |

FOREIGN PATENT DOCUMENTS

| | | |
|---|---|---|
| TW | 521410 | 2/2003 |
| TW | I252569 | 4/2006 |

OTHER PUBLICATIONS

Iwasaki et al., "Development of 30 micron Pitch Bump Interconnections for COC-FCBGA", Electronic Components and Technology Conference, Jul. 13, 2006, pp. 1216-1222.
Takahashi et al., "Current Status of Research and Development for Three-Dimensional Chip Stack Technology", Jpn. J. Appl. Phys., Jul. 13, 2010, pp. 3032-3037.
Takahashi et al., "Ultra-high-density interconnection technology of three-dimensional Packaging", Microelectronics Reliability, Jul. 13, 2003, pp. 1267-1279.
Takahashi et al., "High-Performance Vertical Interconnection for high-density 3D Chip Stacking Package", Jpn. J. Appl. Phys., Jul. 13, 2001, pp. 3032-3037.
Huebner et al., "Microcontacts with sub-30 um pitch for 3D chip-on-chip integration", Microelectronic Engineering, Jul. 13, 2006, pp. 2155-2162.
"Office Action of Taiwan Counterpart Application", issued on May 7, 2013, p1-p5.

\* cited by examiner

*Primary Examiner* — Wensing Kuo
(74) *Attorney, Agent, or Firm* — Jianq Chyun IP Office

(57) ABSTRACT

This disclosure related to a stacked chip package structure having a sloped dam structure located on the substrate and beside the chip stack. The dam structure can facilitate the dispensing process of the underfill.

12 Claims, 4 Drawing Sheets

THREE DIMENSIONAL STACKED CHIP PACKAGE STRUCTURE

CROSS-REFERENCE TO RELATED APPLICATION

This application claims the priority benefit of Taiwan application serial no. 99147323, filed Dec. 31, 2010. The entirety of the above-mentioned patent application is hereby incorporated by reference herein and made a part of this specification.

BACKGROUND

1. Technical Field

The present disclosure relates to a package structure, in particular, to a stacked chip package structure.

2. Description of Related Art

Three-dimensional integrated circuit (3D IC) refers to vertically stacked chips connected by through-silicon via (TSV) technology, which shortens the connections between the stacked chips, reduces the sizes of the device or package and improves the operation band width. The design of 3D integrated circuit can effectively increase the product performance, lower the power consumption and costs, miniaturize the size and integrate hetero-integrated circuit.

For 3D integrated circuits incorporated with through-silicon via technology, the distance between the stacked chips becomes very small, probably less than 100 microns, and the reliability issue becomes significant following the tight arrangement of solder balls. Smaller pitch of the solder balls means smaller joint area of the solder balls. Compared with the typical large solder balls, the mechanical stress induced by fatigue and thermal cycling is concentrated within a smaller area of the solder joint, and if not properly treated, the breakage of the solder joint may occur.

The solution is to apply underfill under the chip or surface mounting device. Although the underfill may fill the gap between the integrated circuit and the carrying substrate, how to dispense the underfill between the stacked chips effectively and efficiently is an issue.

SUMMARY

This disclosure provides a stacked chip package structure. The package structure includes a substrate, at least a chip stack disposed on the substrate, a dam structure disposed on the substrate and an underfill filled between the chips of the chip stack. The dam structure lies against at least one side of the chip stack. The dam structure has at least a slanted surface extending from the substrate to a height above the middle of the chip stack.

In order to make the aforementioned and other features and advantages of the present disclosure more comprehensible, several embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION

This disclosure relates to integrated stacked chip package structure and the related manufacturing processes. As the gaps between the stacked chips can be substantially fully covered by the underfill, the solder joints are well protected and the solder joint reliability between the chips is enhanced, thus alleviating undesirable breakage of the solder joint.

The chip or die as described herein includes all the known chips in the electronics or semiconductor fields, preferably but not limited to, thinned chips, memory chips or high-frequency chips.

Figure 1:
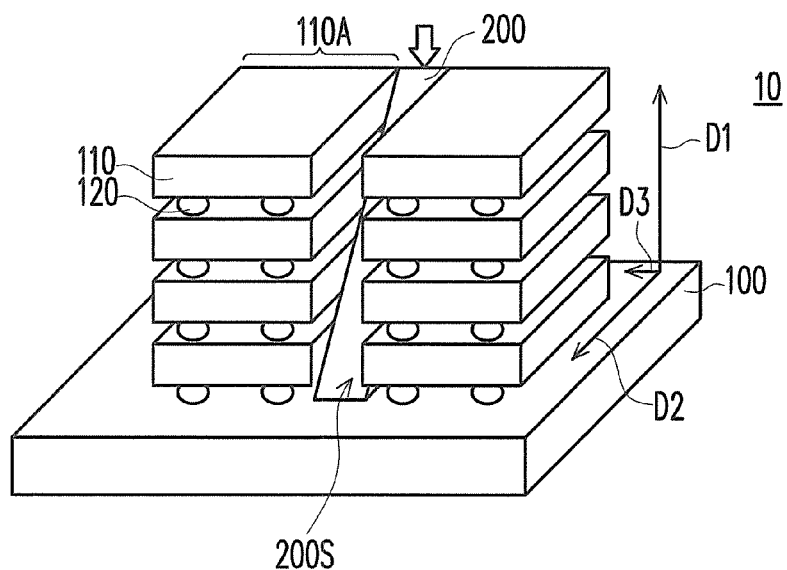
FIG. 1 is a schematic three dimensional view of a stacked chip package structure according to an embodiment of the present disclosure.
Figure 2:
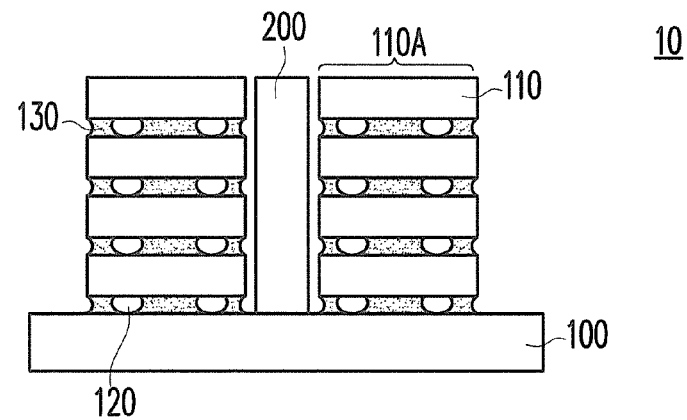
FIG. 2 is a schematic side view of a stacked chip package structure according to an embodiment of the present disclosure.
Figure 3:
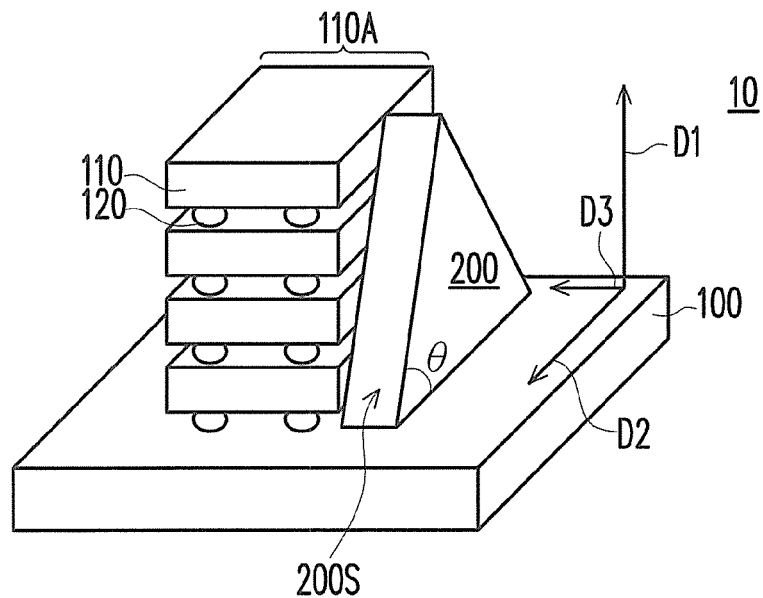
FIG. 3 is a schematic three dimensional view of a part of a stacked chip package structure according to another embodiment of the present disclosure.

FIG. 1 is a schematic three dimensional view of a stacked chip package structure according to an embodiment of the present disclosure. FIG. 2 is a schematic side view of a stacked chip package structure according to an embodiment of the present disclosure. FIG. 3 is a schematic three dimensional view of a part of a stacked chip package structure according to another embodiment of the present disclosure.

Referring to FIG. 1, before undefilling, the package structure 10 includes a plurality of chips 110 (four chips stacked together as a chip stack 110A herein, but the number of the stacked chips is not limited to be four) disposed on a substrate 100, a plurality of bumps 120 disposed between the chips 100, and a sloped dam structure 200 disposed on the substrate 100. The chips 110 are piled up on the substrate 100 and are electrically connected to each other or to the substrate 100 through the bumps 120 (i.e. through flip chip bonding). If the stacking direction of the chip stack (i.e. the thickness direction of the stacked chips) is set as the first direction D1, also called as the vertical direction, the extending direction along one side of the chip 110 and perpendicular to the first direction is set as the second direction D2, and the direction perpendicular to the first and second directions is set as the third direction D3. The substrate 100 can be a printed circuit board or a semiconductor substrate with a single-layer circuit or a multi-layer circuit, for example, or even an interposer made of silicon or glass.

The sloped dam structure 200 is disposed beside the stacked chips 110 and between the chip stacks 110A. The dam structure 200 leans against the stacked chips 110. The dam structure 200 is a triangular prism structure having two opposite side surfaces in a right-triangle shape and a slanted surface 200S in-between. The slanted surface 200S extends from the top of the chip stack 110A, along the second direction D2, to the substrate 100 at an angle. The tilt angle can be calculated by dividing the height of the chip stack along D1 with the extending distance (length) of the dam structure 200 along D2.

As the slanted surface 200S of the dam structure 200 extending from the top layer of the chip stack 110A to the substrate 100 at an angle, the dispensed underfill can use the slanted surface 200S as a flow path during the underfilling process (the flow direction of the underfill shown in arrows). FIG. 2 shows the package structure 10 after underfilling.

The underfill 130 flowing along the slanted surface 200S of the dam structure 200 fills up the gap between the stacked chips 110 through capillary action and the underfilling is completed.

Herein, the dam structure 200 is disposed beside the stacked chips 110 and leans against the stacked chips 110. However, the artisans understand that gaps or space may exist between the dam structure and the stacked chips, and the dam structure does not seal the stacked chips. Although the dam structure 200 shown in the figure is substantially co-planar with the top surface of the topmost layer of the chip stack 110A, it is understood that the height of the dam structure 200 merely needs to be at least leveled up with or even higher than the gap (the highest gap) between the topmost layer and the underlying layer of the chip stack 110A. The top layer of the chip stack 110A can refer to the chip at the topmost layer and the upmost gap between the topmost layer and the underlying layer of the chip stack 110A.

FIG. 3 shown a portion of the package structure 10 before underfilling. Although only one chip stack 110A is shown for illustration of the dam structure 200, the package structure 10 may include a plurality of chip stacks 110A. The dam structure 200 is a triangular prism structure having two opposite triangular side surfaces and two slanted surfaces 200S in-between. The slanted surfaces 200S extend from the top layer of the chip stack 110A respectively to the substrate 100. Taking the side surface being an isosceles triangle as an example, the slanted surfaces 200S extend from the top layer of the chip stack 110A to the substrate 100 respectively along two opposite directions of one side of the chip (frontwards and backwards at the direction D2). The slope of the slanted surface 200S can be calculated by dividing the height of the dam structure 200 at the direction D1 with the half extending distance of the dam structure 200 at the direction D2.

During underfilling process, the dispensed underfill can use the slanted surfaces 200S as flow paths (the flow direction of the underfill shown in arrows). The angle θ between slanted surface 200S of the dam structure 200 and the horizontal plane (defined as the substrate surface 100a) ranges between 0 degree to 90 degrees, depending on the shape and/or height of the dam structure and the chip stack.

Figure 4:
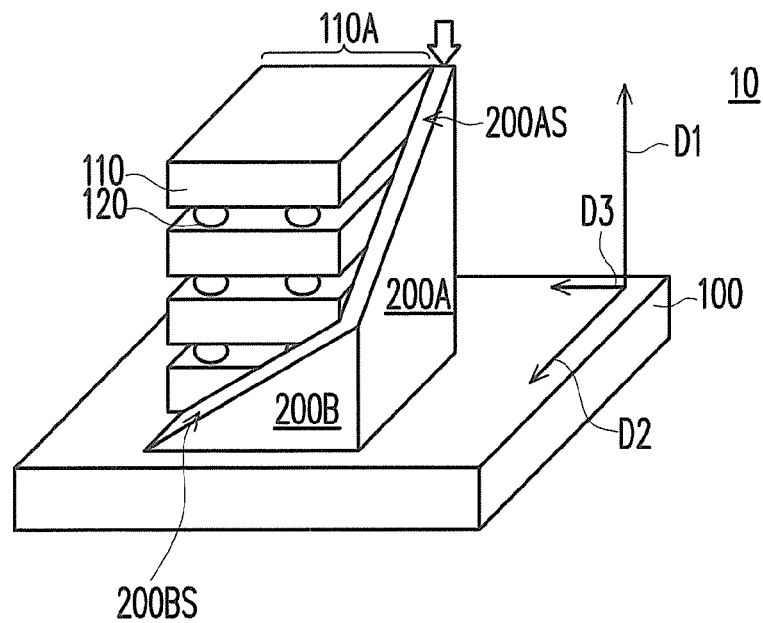
FIG. 4 is a schematic three dimensional view of a part of a stacked chip package structure according to another embodiment of the present disclosure.

FIG. 4 shows the package structure 10 before underfilling, including one or more chip stacks 110A. The dam structure 200 in FIG. 4 can be a trapezoid cuboid 200A (having two trapezoid opposite side surfaces) connected with a triangular prism 200B and extends over two adjacent sides of the chip stack 110A. The trapezoid cuboid 200A has a slanted surface 200AS, while the triangular prism also has a slanted surface 200BS. Extending over two adjacent sides, the slanted surface 200AS extends aslant from the top layer of the chip stack 110A along the direction D2 at one side, and the connected slanted surface 200BS extends aslant along the direction D3 to the substrate 100 at the other side. For the dam structure 200A/200B, the slopes of the two slanted surface 200AS and 200BS can be the same or different. During undefilling, the underfill can use the connected slanted surfaces 200AS/200BS as the flow path (the flow direction of the underfill shown in arrows).

Figure 5:
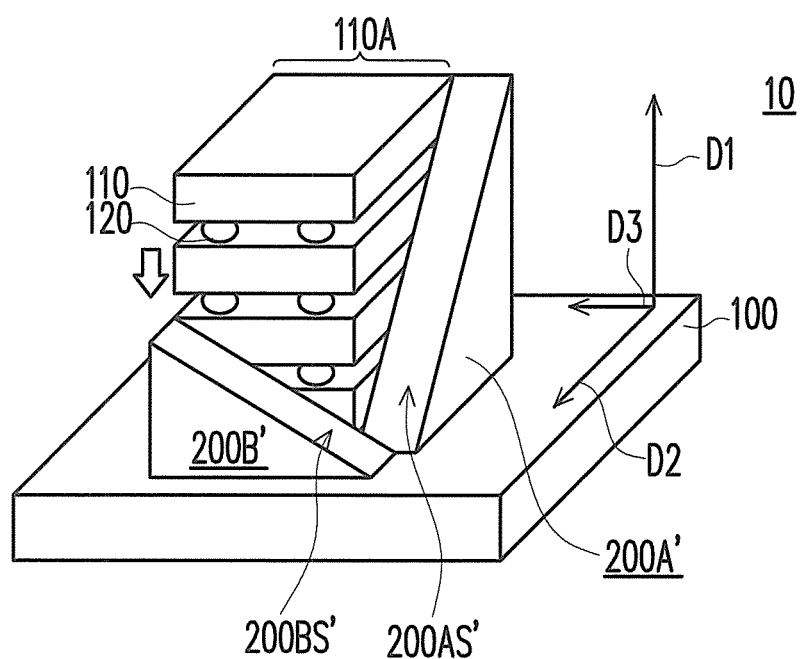
FIG. 5 is a schematic three dimensional view of a part of a stacked chip package structure according to another embodiment of the present disclosure.

FIG. 5 shows the package structure 10 before underfilling, including one or more chip stacks 110A. The dam structure 200 in FIG. 5 has a triangular prism 200A' and a triangular prism 200B'detached from the triangular prism 200A', and the two parts 200A'/200B' lean against two adjacent sides of the chip stack 110A. The triangular prism 200A' has a slanted surface 200AS', while the triangular prism 200B' also has a slanted surface 200BS'. The slanted surface 200AS' extends aslant from the top layer of the chip stack 110A along the direction D2 to the substrate 100 at one side. At the other side, another slanted surface 200BS' extends aslant from a middle layer of the chip stack 110A along the direction D3 to the substrate 100. For the dam structure 200A'/200B', the slopes of the two slanted surface 200AS' and 200BS' are different. During undefilling, the underfill can selectively use one of the slanted surfaces 200AS'/200BS' as the flow path (the flow direction of the underfill shown in arrows). For example, the slanted surface 200BS' is firstly used to fill the gaps between the bottom two chips and the underfill flows along the slanted surface 200BS' (the flow direction of the underfill shown in arrows). Subsequently, the same or different underfill is dispensed and flows along the slanted surface 200AS' to fill the gaps between the upper chips. In this case, different undefil materials may be used for chips of various sizes or different types, and better package performance can be achieved.

Figure 6A:
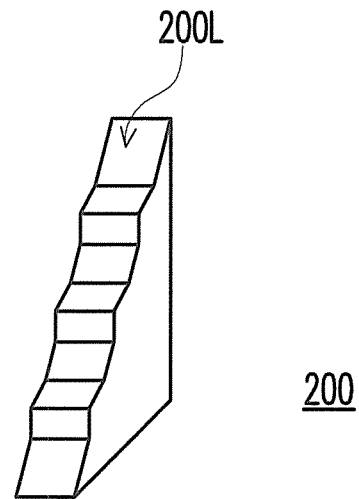
FIGS. 6A-6B are schematic three dimensional views illustrating the dam structure according to one embodiment of the present disclosure.
Figure 6B:
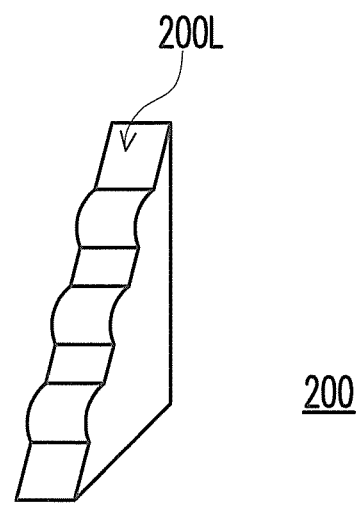

According to the embodiments of this disclosure, the dam structure is located beside at least one or more sides of the chip stack. The dam structure is designed to have slanted surface(s) for facilitate underfilling. However, it is well understood that the dam structure 200 can be designed to have stepped slope 200L as shown in FIG. 6A-6B, leaning against one or more sides of the chip stack 110A for underfilling.

The package structure or the related underfilling processes are applicable for the stacked package structures with TSVs, and the underfill can completely fill up the gaps between the small pitched stacked chips. The dam structure of this disclosure can facilitate underfilling and reinforce the package structure.

In general, the underfill material can be thermosetting polymer materials, such as epoxy resins, cyanate resins, or acrylic resins. The material of the dam structure 200 should be gel materials of high thixotropy, such as high thixotropic epoxy resins. Under shear stress, the viscosity of the thixotropic epoxy resins will be reduced to the half or more. However, under normal conditions without shear stress, the thixotropic epoxy resins regain its original viscosity. The high thixotropic material of the dam structure 200 has a viscosity ranging between 100,000 cps~1,300,000 cps, higher than the viscosity of the underfill material (ranging between 5000 cps~25,000 cps).

As the dam structure is made of a high thixotropic material, it is possible to form the dam structure by dispensing or molding. The dispenser can be used to mass-produce the dam structure by dispensing, which is compatible with the presently existing processes.

If singulation or further cutting process is performed to the stacked chip package structure of this disclosure, the dam structure made of a high thixotropic material can be easily cut without damaging the whole structure of the stacked chip package structure or the solder joints of the stacked chip package structure.

For evaluation, at least two different high thixotropic materials are used to form the dam structure in the following embodiments by dispensing, and the results are shown in Table 1. Various pore sizes of the needles for dispensing the high thixotropic materials are employed to estimate the dimensions of the obtained dam structures.

TABLE 1

|  | FP6401 | | | FP4451TD | | |
| --- | --- | --- | --- | --- | --- | --- |
| Needle pore size | 14 | 16 | 21 | 14 | 16 | 21 |
| Diameter of pore size (mm) | 1.52 | 0.8382 | 0.508 | 1.52 | 0.8382 | 0.508 |
| dam width (mm) | 1.604 | 0.833 | 0.64 | 1.506 | 0.930 | 0.621 |
| dam height (mm) | 1.241 | 0.613 | 0.337 | 1.155 | 0.588 | 0.350 |
| aspect ratio | 0.774 | 0.735 | 0.526 | 0.767 | 0.632 | 0.563 |
| appearance | stable | stable | unstable | stable | stable | unstable |

It is found that stable dam structures are obtained only when the needles of appropriate pore sizes are employed. When the needles of pore sizes of 0.8~1.6 mm, the resultant dam structure has a height of about 0.5~1.5 mm. In fact, the dam structure formed by dispensing can reach a height higher than 1 mm, even upto 2 mm. Hence, the dam structures formed by dispensing are high or elevated enough to cover the side(s) of the chip stack.

The stacked chip package structure of this dislclosure incorporated the dam structure to facilitate the underfilling, which improves the underfilling and alleviates bubbles or gaps exisitng in the underfill.

It will be apparent to those skilled in the art that various modifications and variations can be made to the structure of the disclosed embodiments without departing from the scope or spirit of the disclosure. In view of the foregoing, it is intended that the present disclosure cover modifications and variations of this disclosure provided they fall within the scope of the following claims and their equivalents.

What is claimed is:

1. A stacked chip package structure, comprising:
   at least a chip stack disposed on a substrate, wherein the chip stack includes at least two chips piled up over the substrate in a first direction;
   a dam structure disposed on the substrate, wherein the dam structure leans against at least one side of the chip stack, the dam structure has at least one slanted surface extending aslant along the at least one side of the chip stack and from a middle or higher of the chip stack to the substrate; and
   an underfill filled between the chips of the chip stack.

2. The stacked chip package structure of claim 1, wherein the dam structure is a triangular prism having a side surface in a right-triangle shape and a slanted surface.

3. The stacked chip package structure of claim 1, wherein the dam structure is a triangular prism having a side surface in an isosceles-triangle shape and a slanted surface.

4. The stacked chip package structure of claim 1, wherein the dam structure includes a trapezoid cuboid and a triangular prism connected to the trapezoid cuboid, the trapezoid cuboid leans against one side of the chip stack and has a first slanted surface, the triangular prism leans against another side of the chip stack and has a second slanted surface connected to the first slanted surface, the connected first and second slanted surfaces extend aslant over two adjacent sides of the chip stack and extend from a middle or higher of the chip stack to the substrate.

5. The stacked chip package structure of claim 1, wherein the dam structure includes a first triangular prism and a second triangular prism, the first triangular prism leans against one side of the chip stack and has a first slanted surface, the second triangular prism leans against another side of the chip stack and has a second slanted surface, the first slanted surface extends aslant from a middle or higher of the chip stack to the substrate at one side, and the second slanted surface extends aslant from the middle of the chip stack to the substrate at another side.

6. The stacked chip package structure of claim 1, wherein the dam structure is located between two chip stacks and leans against both chip stacks.

7. The stacked chip package structure of claim 1, wherein the substrate is a semiconductor substrate, an interposer or a printed circuit board.

8. The stacked chip package structure of claim 1, wherein a material of the dam structure includes a high thixotropic material having a viscosity ranging between 100,000 cps~1,300,000 cps and higher than a viscosity of the underfill.

9. The stacked chip package structure of claim 1, wherein the dam structure includes a stepped slope.

10. The stacked chip package structure of claim 1, wherein the chip is a thinned chip, a memory chip or a high-frequency chip.

11. The stacked chip package structure of claim 1, wherein the chip stack includes at least two chips electrically connected to the substrate by flip chip bonding.

12. The stacked chip package structure of claim 1, wherein the dam structure extends from a top layer of the chip stack to the substrate.

* * * * *